United States Patent
Kojima (10) Patent No.: US 7,952,359 B2
(45) Date of Patent: May 31, 2011

(54) TEST APPARATUS HAVING BIDIRECTIONAL DIFFERENTIAL INTERFACE

(75) Inventor: Shoji Kojima, Tokyo (JP)

(73) Assignee: Advantest Corporation (JP)

( * ) Notice: Subject to any disclaimer, the term of this patent is extended or adjusted under 35 U.S.C. 154(b) by 279 days.

(21) Appl. No.: 12/390,292

(22) Filed: Feb. 20, 2009

(65) Prior Publication Data

US 2009/0206843 A1    Aug. 20, 2009

(51) Int. Cl.
*G01R 31/08* (2006.01)
(52) U.S. Cl. .......................................................... 324/522
(58) Field of Classification Search .................. None
See application file for complete search history.

(56) References Cited

U.S. PATENT DOCUMENTS

| | | | |
|---|---|---|---|
| 3,725,582 A | 4/1973 | Davis | 178/58 |
| 5,666,302 A * | 9/1997 | Tanaka et al. | 708/819 |
| 6,573,764 B1 | 6/2003 | Taylor | 327/108 |
| 7,190,194 B2 | 3/2007 | Nagahori et al. | 327/110 |
| 7,772,892 B2 * | 8/2010 | Kojima | 327/65 |
| 2010/0271080 A1 * | 10/2010 | Kojima | 327/108 |

FOREIGN PATENT DOCUMENTS

| | | | |
|---|---|---|---|
| JP | 47-11702 | | 6/1972 |
| JP | 08-023354 | | 1/1996 |
| JP | 08-023354 A | * | 1/1996 |
| JP | 2006-23233 | | 1/2006 |

OTHER PUBLICATIONS

Machine English Translation, Tanaka et al. JP 08023354 A, p. 1-14, Jan. 1996.*

* cited by examiner

*Primary Examiner* — Ha Tran T Nguyen
*Assistant Examiner* — Alesa Allgood
(74) *Attorney, Agent, or Firm* — Martine Penilla & Gencarella, LLP (57) ABSTRACT

First and second resistors are provided between a first input/output terminal and a power supply terminal, and between a second input/output terminal and the power supply terminal, respectively. Third and fourth resistors are connected to the second and first input/output terminals, respectively. First and second current-switching switches couple either the first input/output terminal side or the second input/output terminal side with a first current source and a second current source, respectively, according to the value of pattern data. A level shift circuit shifts the electric potentials at the second terminals of the third and forth resistors by a predetermined level. A comparator circuit compares the electric potentials at the second terminals of the third and fourth resistors level-shifted by the level shift circuit with those at the second terminals of the fourth and third resistors, respectively, and generates first and second comparison signals according to the comparison results.

9 Claims, 5 Drawing Sheets

TEST APPARATUS HAVING BIDIRECTIONAL DIFFERENTIAL INTERFACE

CLAIM OF PRIORITY

The present application is claiming foreign priority of Japanese Patent Application No. 2008-038840, filed on Feb. 20, 2008, the content of which is incorporated herein by reference.

BACKGROUND OF THE INVENTION

1. Field of the Invention

The present invention relates to a test apparatus, and particularly to a technique for testing a device under test which transmits/receives a differential signal.

2. Description of the Related Art

In order to transmit/receive signals among semiconductor devices, a differential signal is employed. For example, XDR-DRAM (eXtreme Data Rate Dynamic Random Access Memory) transmits a differential signal at a high speed in a bidirectional manner using a single differential transmission line. In the case of testing a device having such a bidirectional differential interface, a test is performed in which the amplitude of a differential signal output from a device under test (DUT) is measured so as to judge the quality of the DUT.

Discussion will be made regarding a test apparatus which tests a DUT having a bidirectional differential interface. The test apparatus includes a transmitter and a receiver connected to a common differential transmission line pair (which will also be referred to as simply a "differential transmission line" hereafter). The transmitter transmits a test pattern to the DUT. The receiver judges the logical value of a differential signal pair (which will also be referred to as simply a "differential signal" hereafter), or checks the amplitude of the difference in voltage between the signals in the differential signal pair.

The receiver of the test apparatus is connected to the DUT via the differential transmission line pair. With such an arrangement, the receiver is also connected to the transmitter on the test apparatus side. Accordingly, there is a need to design such a DUT test apparatus including a bidirectional differential interface so as to protect the receiver thereof from being affected by the output of the transmitter arranged adjacent to the receiver. Related techniques are described in Patent documents 1 through 3. In particular, Patent document 1 discloses a circuit (hybrid circuit) in which, in a bidirectional communication, the circuit receives only a signal from the other circuit by canceling out the transmission signal output from the former circuit itself.

[Patent Document 1]
 Japanese Patent Application Laid Open No. S47-11702
[Patent Document 2]
 Japanese Patent Application Laid Open No. H08-23354
[Patent Document 3]
 Japanese Patent Application Laid Open No. 2006-23233
[Patent Document 4]
 U.S. Pat. No. 6,573,764 B1
[Patent Document 5]
 U.S. Pat. No. 7,190,194 B2

SUMMARY OF THE INVENTION

The present invention has been made in view of such a situation. Accordingly, it is a general purpose of the present invention to provide a test apparatus for a DUT having a bidirectional differential interface.

An embodiment of the present invention relates to a test apparatus which transmits/receives a differential signal to/from a device under test in a bidirectional manner via a differential transmission line so as to test the device under test. The test apparatus includes: first and second input/output terminals connected to the differential transmission line; a first resistor provided between the first input/output terminal and a fixed-voltage terminal; a second resistor provided between the second input/output terminal and the fixed-voltage terminal; a first current source which generates a predetermined first tail current; a first current-switching switch which receives pattern data to be transmitted to the device under test, selects either the first input/output terminal side or the second input/output terminal side according to the value of the pattern data thus received, and couples the input/output terminal thus selected with the first current source; a third resistor with the first terminal thereof connected to the second input/output terminal; a fourth resistor with the first terminal thereof connected to the first input/output terminal; a second current source which generates a predetermined second tail current; a second current-switching switch which receives the pattern data, selects either the first input/output terminal side or the second input/output terminal side according to the value of the pattern data thus received, and couples the input/output terminal thus selected with the second current source; a level shift circuit which shifts the electric potential at the second terminal of the third resistor and the electric potential at the second terminal of the fourth resistor by a predetermined level; and a comparator circuit which compares the electric potential at the second terminal of the third resistor, which has been level-shifted by the level shift circuit, with the electric potential at the second terminal of the fourth resistor, generates a first comparison signal according to the comparison result, compares the electric potential at the second terminal of the fourth resistor, which has been level-shifted by the level shift circuit, with the electric potential at the second terminal of the third resistor, and generates a second comparison signal according to the comparison result.

The first and second transistors, the first and second resistors, and the first current source form a main current driver amplifier. The third and fourth transistors, the third and fourth resistors, and the second current source form a second current driver amplifier. With such an embodiment, the second current driver thus provided cancels out the effects of the output of the main driver amplifier on the input voltage of the comparator circuit, thereby enabling amplitude judgment to be performed for the differential signal output from the device under test. It should be noted that, in the present specification, the first terminal of a given circuit element denotes a terminal on the higher electric potential side, and the second terminal thereof denotes a terminal on the lower electric potential side.

Ordinary differential receivers require a differential amplifier (analog subtractor) to amplify the difference between a pair of differential input signals and to convert the differential signal into a single ended signal. However, with such an embodiment, the receiver does not require such a differential amplifier.

With the resistances of the first and second resistors as $Ra$, the resistances of the third and fourth resistors may be set to approximately the same value represented by $\alpha \cdot Ra$ ($\alpha$ represents a parameter).

With the current value of the second tail current as $Ib$, and with the current value of the first tail current as $(Ia+Ib)$, an arrangement may be made in which the Expression $Ib=Ia/(2\cdot\alpha)$ is satisfied.

Such an arrangement properly cancels out the effects of the output of the main driver amplifier on the input voltage of the comparator circuit.

Also, the level shift circuit may include: a fifth resistor with the first terminal thereof connected to the second terminal of the third resistor; a third current source which is connected to the second terminal of the fifth resistor, and generates a predetermined current; a sixth resistor with the first terminal thereof connected to the second terminal of the fourth resistor; and a fourth current source which is connected to the second terminal of the sixth resistor, and generates a predetermined current. The electric potentials at the second terminals of the fifth and sixth resistors may be respectively output.

With such an arrangement, with the resistances of the fifth and sixth resistors as Rc, and with the currents generated by the third and fourth current sources as Ic, the test apparatus is capable of performing an amplitude margin test based upon the threshold voltage represented by the following Expression: Vth=2×Rc×Ic.

Also, the comparator circuit may include a first comparator which compares the electric potential at the second terminal of the third resistor, which has been level-shifted by the level shift circuit, with the electric potential at the second terminal of the fourth resistor; and a second comparator which compares the electric potential at the second terminal of the fourth resistor, which has been level-shifted by the level shift circuit, with the electric potential at the second terminal of the third resistor. The test apparatus may further include: a seventh resistor provided between one of the input terminals of the first comparator and the second terminal of the fourth resistor; and an eighth resistor provided between one of the input terminals of the second comparator and the second terminal of the third resistor.

In some cases, the fifth resistor and the capacitance of the third current source combine with each other to form a filter. Similarly, in some cases, the sixth resistor and the capacitance of the fourth current source combine with each other to form a filter. In this case, only one of the input signals of each comparator is delayed, or the waveform thereof is distorted. By providing the seventh and eighth resistors, such an arrangement applies a uniform delay or uniform waveform distortion to the two input signals of each comparator.

Also, the comparator circuit may include: a first comparator which compares the electric potential at the second terminal of the third resistor, which has been level-shifted by the level shift circuit, with the electric potential at the second terminal of the fourth resistor; and a second comparator which compares the electric potential at the second terminal of the fourth resistor, which has been level-shifted by the level shift circuit, with the electric potential at the second terminal of the third resistor. The test apparatus may further include: a first capacitor provided between one of the input terminals of the first comparator and a fixed-voltage terminal; and a second capacitor provided between one of the input terminals of the second comparator and a fixed-voltage terminal.

Such an arrangement also applies a uniform delay or uniform waveform distortion to the two input signals of each comparator.

Also, the comparator circuit may include: a first comparator which compares the electric potential at the second terminal of the third resistor, which has been level-shifted by the level shift circuit, with the electric potential at the second terminal of the fourth resistor; and a second comparator which compares the electric potential at the second terminal of the fourth resistor, which has been level-shifted by the level shift circuit, with the electric potential at the second terminal of the third resistor. The test apparatus may further include: a first dummy current source, with the current value set to zero, which is provided between one of the input terminals of the first comparator and a fixed-voltage terminal, and has the same configuration as that of the third current source; and a second dummy current source, with the current value set to zero, which is provided between one of the input terminals of the second comparator and a fixed-voltage terminal, and has the same configuration as that of the fourth current source.

The first and second dummy current sources have the same configurations as those of the third and fourth current sources, respectively. Thus, such an arrangement more properly applies a uniform delay or uniform waveform distortion to the two input signals of each comparator.

Also, multiple level shift circuits may be provided in parallel. Also, the comparator circuit may be provided to each of the multiple level shift circuits.

With such an arrangement, there is a difference in the level shift amount among the level shift circuits. Thus, such an arrangement is capable of comparing the amplitude of the differential signal with multiple different thresholds at the same time.

Also, the first current-switching switch may be a differential transistor pair including: a first transistor with the first terminal thereof connected to the first input/output terminal; and a second transistor with the first terminal thereof connected to the second input/output terminal, and with the second terminal thereof connected to the second terminal of the first transistor so as to form a common second terminal. Also, the second current-switching switch may be a differential transistor pair including: a third transistor with the first terminal thereof connected to the second terminal of the third resistor; and a fourth transistor with the first terminal thereof connected to the second terminal of the fourth resistor, and with the second terminal thereof connected to the second terminal of the third transistor so as to form a common second terminal.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not affect the electric connection therebetween, in addition to a state in which the member A is physically and directly connected to the member B. In the same way, the state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

Figure 1:
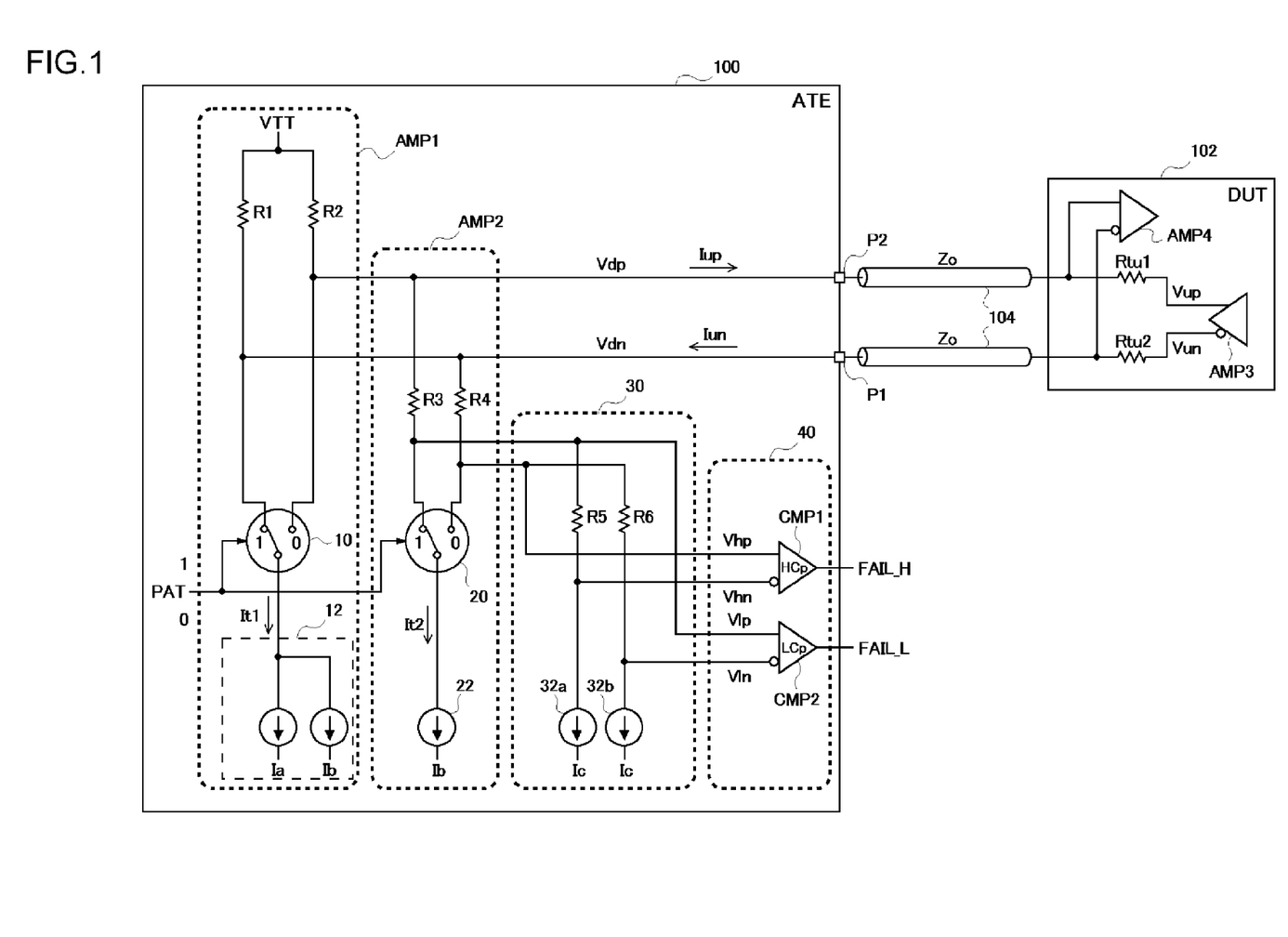
FIG. 1 is a circuit diagram which shows a configuration of an ATE according to an embodiment.

An embodiment described below relates to an automatic test equipment (ATE) which tests a device under test (DUT) having a bidirectional differential interface. FIG. 1 is a circuit diagram which shows a configuration of an ATE 100 according to the embodiment. The ATE 100 is connected to a DUT 102 via a differential transmission line 104. The ATE 100 outputs a differential signal to the DUT 102. Also, the ATE 100 receives a differential signal output from the DUT 102.

The DUT 102 includes a transmitter amplifier AMP3, a receiver amplifier AMP4, and output resistors Rtu1 and Rtu2. The receiver amplifier AMP4 generates the difference in voltage (differential component) between the differential signals input via the differential transmission line 104, and transmits the difference in voltage to an internal circuit (not shown). The differential signal output from the transmitter amplifier AMP3 is input to the ATE 100 via the differential transmission line 104. The transmitter amplifier AMP3 includes the output resistors Rtu1 and Rtu2. The characteristic impedance Zo of the differential transmission line 104 matches that of the output resistors Rtu1 and Rtu2 included in the DUT 102.

The ATE 100 includes a first input/output terminal P1, which is to be connected to one line of the differential transmission line 104, and a second input/output terminal P2, which is to be connected to the other line thereof. Furthermore, the ATE 100 includes a main driver amplifier AMP1, a cancel driver amplifier AMP2, a level shift circuit 30, and a comparator circuit 40.

The main driver amplifier AMP1 and the cancel driver amplifier AMP2 output a differential signal Vd based upon pattern data PAT to be transmitted to the DUT 102. Hereafter, the two signal components of the differential signal Vd, i.e., the positive signal component and the negative signal component thereof, will be referred to as "Vdp" and "Vdn", respectively, using the suffixes "p" and "n". Also, these signal components will also be referred to collectively as "Vd", omitting these suffixes as appropriate. Different differential signals will also be referred to in the same fashion.

The main driver amplifier AMP1 is a differential current driver including a first resistor R1, a second resistor R2, a first current-switching switch 10, and a first current source 12.

The first resistor R1 is provided between the first input/output terminal P1 and a fixed-voltage terminal (which will be referred to as the "power supply terminal" hereafter) VTT. The second resistor R2 is provided between the second input/output terminal P2 and the power supply terminal VTT.

The first current source 12 generates a predetermined first tail current It1. The first current-switching switch 10 receives the pattern data PAT to be transmitted to the DUT 102, selects either the first input/output terminal P1 side or the second input/output terminal P2 side according to the value of the pattern data PAT (i.e., 1 or 0), and couples the input/output terminal thus selected with the first current source 12. In other words, when PAT equals 1, the first tail current It1 flows through the first resistor R1 side, and when PAT equals 0, the first tail current It1 flows through the second resistor R2 side.

Figure 2:
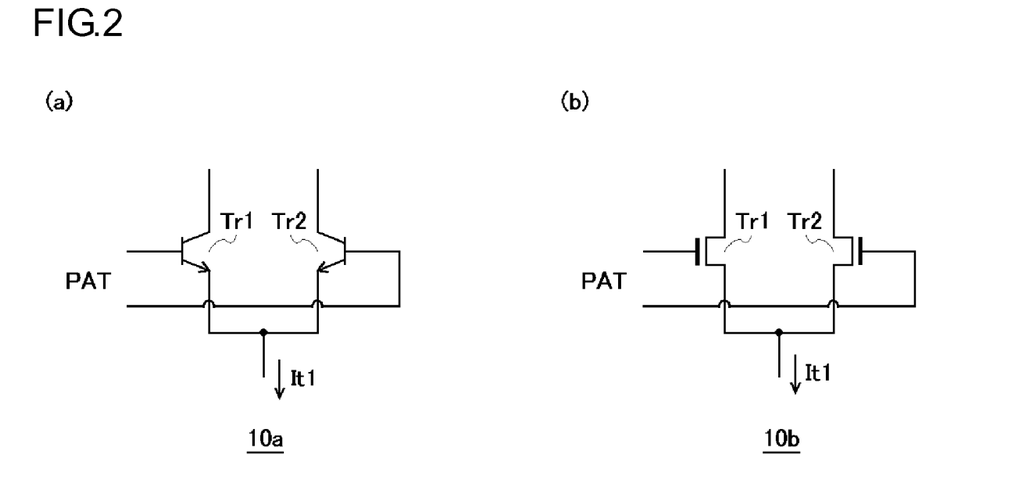
FIGS. 2A and 2B are circuit diagrams which show example configurations of a first current-switching switch.

FIGS. 2A and 2B are circuit diagrams which show example configurations of the first current-switching switch 10. As shown in FIGS. 2A and 2B, the first current-switching switch 10 can be configured as a differential transistor pair. The main driver amplifier AMP1 is configured as an open collector (or open drain) output type differential driver.

Each of the first current-switching switches 10a and 10b shown in FIGS. 2A and 2B includes a first transistor Tr1 and a second transistor Tr2. The transistors Tr1 and Tr2 shown in FIG. 2A are NPN bipolar transistors. The first terminal (collector) of the first transistor Tr1 is connected to the first input/output terminal P1, and is pulled up to the power supply terminal VTT via the first resistor R1. The first terminal (collector) of the second transistor Tr2 is connected to the second input/output terminal P2, and is pulled up to the power supply terminal VTT via the second resistor R2. The second terminals (emitters) of the first transistor Tr1 and the second transistor Tr2 are connected to each other so as to form a common emitter terminal which is connected to the current source which supplies the tail current It1. The pattern data PAT is input to the control terminals (bases) of the first transistor Tr1 and the second transistor Tr2.

The first current-switching switch 10b shown in FIG. 2B has the same configuration as shown in FIG. 2A except that the transistors Tr1 and Tr2 have been replaced by N-channel MOSFETs. The first terminal, the second terminal, and the control terminal respectively correspond to the drain, the source, and the gate.

It should be noted that the configurations of the first current-switching switch 10 and the second current-switching switch 20 are not restricted to such configurations including the differential transistor pair shown in FIGS. 2A and 2B. Also, an arrangement may be made employing a switching element that is different from a transistor.

Returning to FIG. 1, the cancel driver amplifier AMP2 is the same kind of differential current driver as the main driver amplifier AMP1, and includes a third resistor R3, a fourth resistor R4, a second current-switching switch 20, and a second current source 22.

The third resistor R3 is arranged with the first terminal connected to the second input/output terminal P2. The fourth resistor R4 is arranged with the first terminal connected to the first input/output terminal P1. The second current source 22 generates a predetermined second tail current It2. The second current-switching switch 20 receives the pattern data PAT, selects either the first input/output terminal P1 side or the second input/output terminal P2 side according to the value of the pattern data PAT, and couples the input/output terminal thus selected with the second current source 22.

In other words, when PAT equals 1, the second tail current It2 flows through the third resistor R3 side, and when PAT equals 0, the second tail current It2 flows through the fourth resistor R4 side.

The second current-switching switch 20 can also be configured as a differential transistor pair shown in FIGS. 2A and 2B in the same way as with the first current-switching switch 10. That is to say, the second current-switching switch 20 has a configuration including a third transistor (which corresponds to the first transistor Tr1 shown in FIGS. 2A and 2B) and a fourth transistor (which corresponds to the second transistor Tr2 shown in FIGS. 2A and 2B). The first terminal (collector) of the third transistor is connected to the second terminal of the third resistor R3. The first terminal (collector) of the fourth transistor is connected to the second terminal of the fourth resistor R4. The second terminals (emitters) of the third transistor and the fourth transistor are connected to each other so as to form a common terminal which is connected to the current source which supplies the tail current It2.

In other words, the collector of the third transistor is pulled up to the power supply terminal VTT via the third resistor R3 and the second resistor R2. Furthermore, the collector of the fourth transistor is pulled up to the power supply terminal VTT via the fourth resistor R4 and the first resistor R1.

The level shift circuit 30 shifts the electric potential Vlp at the second terminal of the third resistor R3 and the electric potential Vhp at the second terminal of the fourth resistor R4 to the low electric potential side by a predetermined level $\Delta V$.

The level shift circuit 30 shown in FIG. 1 includes a fifth resistor R5, a sixth resistor R6, a third current source 32a, and a fourth current source 32b.

The first terminal of the fifth resistor R5 is connected to the second terminal of the third resistor R3. The third current source 32a is connected to the second terminal of the fifth resistor R5, which generates a predetermined current Ic. The first terminal of the sixth resistor R6 is connected to the second terminal of the fourth resistor R4. The fourth current source 32b is connected to the second terminal of the sixth resistor R6, which generates a predetermined current Ic.

In the level shift circuit 30 shown in FIG. 1, in a case in which the resistance values of the fifth resistor R5 and the sixth resistor R6 are both represented by Rc, the level shift amount is represented by the following Expression: $\Delta V = Rc \times Ic$.

Instead of the configuration shown in FIG. 1, the level shift circuit 30 may be configured as a source follower circuit or an emitter follower circuit. In this case, the shift amount $\Delta V$ is set to the threshold voltage of a MOSFET (Metal Oxide Semiconductor Field Effect Transistor) or the diode forward voltage of a bipolar transistor.

The comparator circuit 40 compares the electric potential Vhn at the second terminal of the third resistor R3, which has been shifted by the level shift circuit 30, with the electric potential Vhp at the second terminal of the fourth resistor R4, and generates a first comparison signal FAIL_H according to the comparison result. Furthermore, the comparator circuit 40 compares the electric potential Vln at the second terminal of the fourth resistor R4, which has been shifted by the level shift circuit 30, with the electric potential Vlp at the second terminal of the third resistor R3, and generates a second comparison signal FAIL_L according to the comparison result.

The comparator circuit 40 includes a first comparator CMP1 and a second comparator CMP2. The electric potential Vhn at the second terminal of the third resistor R3, thus level-shifted, is input to the inverting input terminal of the first comparator CMP1. Furthermore, the electric potential Vhp at the second terminal of the fourth resistor R4 is input to the non-inverting input terminal thereof. The comparator CMP1 makes a comparison between these two electric potentials Vhn and Vhp.

The electric potential Vln at the second terminal of the fourth resistor R4, thus level-shifted, is input to the inverting input terminal of the second comparator CMP2. Furthermore, the electric potential Vlp at the second terminal of the third resistor R3 is input to the non-inverting input terminal thereof. The comparator CMP2 makes a comparison between these two electric potentials Vln and Vlp.

The above-described is the basic configuration of the ATE 100. Next, description will be made regarding the operation of the ATE 100.

When Vhp is greater than Vhn, the first comparison signal FAIL_H is set to the high-level state, and when Vhp is smaller than Vhn, the first comparison signal FAIL_H is set to the low-level state. Here, Vhn is represented by the following Expression: $Vhn = Vlp - \Delta V$. Accordingly, when $\Delta V$ is greater than (Vlp−Vhp), the logical value of the first comparison signal FAIL_H is set to 1, and when $\Delta V$ is smaller than (Vlp−Vhp), the logical value of the first comparison signal FAIL_H is set to 0. That is to say, in a case in which the difference in electric potential between the differential signals Vlp and Vhp is smaller than the threshold value $\Delta V$, the first comparison signal FAIL_H is set to the high-level state, whereupon an error judgment is made.

When Vlp is greater than Vln, the second comparison signal FAIL_L is set to the high-level state, and when Vlp is smaller than Vln, the second comparison signal FAIL_L is set to the low-level state. Here, Vln is represented by the following Expression: $Vln = Vhp - \Delta V$. Accordingly, when $\Delta V$ is greater than (Vhp−Vlp), the logical value of the second comparison signal FAIL_L is set to 1, and when $\Delta V$ is smaller than (Vhp−Vlp), the logical value of the second comparison signal FAIL_L is set to 0. That is to say, in a case in which the difference in electric potential between the differential signals Vhp and Vlp is smaller than the threshold value $\Delta V$, the second comparison signal FAIL_L is set to the high-level state, whereupon an error judgment is made.

Because the cancel driver amplifier AMP2 is provided, the ATE 100 according to the embodiment reduces the effects of the output of the main driver amplifier AMP1 on the input voltages of the comparator circuit 40 Vlp, Vhp, Vhn, and Vln. That is to say, such an arrangement properly extracts only the components of the differential signals output from the DUT 102 so as to perform an amplitude margin test. Description will be made below with regard to the reason for this.

In order to simplify the explanation, let us consider an arrangement in which the resistances of the first resistor R1 and the second resistor R2 are set to the same resistance, i.e., Ra, and the third resistor R3 and the fourth resistor R4 are set to the same resistance, i.e., Rb. Furthermore, let us say that the first tail current It1 is represented by the Expression $It1 = Ia + Ib$, and the second tail current It2 is represented by the Expression $It2 = Ib$. Moreover, the resistances of the output resistors Rtu1 and Rtu2 of the DUT 102 are set to the same resistance, i.e., Rtu. The reference numerals that denote different electric signals or circuit elements such as resistors, capacitors, etc., also represent the voltage value, the current value, the resistance, or capacitance, as necessary.

The following Expressions (1) through (4) are obtained based upon the circuit diagram shown in FIG. 1.

$$Vhp = Vdn - Rb \cdot \{(1 - PAT) \cdot Ib + Ic\} \quad (1a)$$

$$Vlp = Vdp - Rb \cdot \{PAT \cdot Ib + Ic\} \quad (1b)$$

$$Vhn = Vlp - Rc \cdot Ic \quad (2a)$$

$$Vln = Vhp - Rc \cdot Ic \quad (2b)$$

$$Vdp = VTT - Ra \cdot \{(1 - PAT) \cdot (Ia + Ib) + PAT \cdot Ib + Iup + Ic\} \quad (3a)$$

$$Vdn = VTT - Ra \cdot \{PAT \cdot (Ia + Ib) + (1 - PAT) \cdot Ib - Iun + Ic\} \quad (3b)$$

$$Iup = (Vdp - Vup)/Rtu \quad (4a)$$

$$Iun = (Vun - Vdn)/Rtu \quad (4b)$$

Here, by introducing a virtual voltage VT, the power supply voltage VTT is defined as follows.

$$VTT = VT + Ra \cdot \{Ib + Ic\} \quad (5)$$

Furthermore, assuming that impedance matching is provided between the DUT 102 side and the ATE 100 side, the following Expression (6) is satisfied.

$$Rtu=Ra \tag{6}$$

By substituting Expressions (4a), (4b), (5), and (6) into Expressions (3a) and (3b), the following Expressions are obtained.

$$Vdp=\tfrac{1}{2}\cdot\{VT-Ra\cdot(1-PAT)\cdot Ia+Vup\} \tag{7a}$$

$$Vdn=\tfrac{1}{2}\cdot\{VT-Ra\cdot PAT\cdot Ia+Vun\} \tag{7b}$$

Next, the input voltage of the first comparator CMP1 and the input voltage of the second comparator CMP2 are obtained. By substituting Expressions (7a) and (7b) into Expressions (1a) and (1b), the following Expressions (8a) and (8b) are obtained.

$$Vhp=\tfrac{1}{2}\cdot\{VT-Ra\cdot PAT\cdot Ia+Vun\}-Rb\cdot\{(1-PAT)\cdot Ib+Ic\} \tag{8a}$$

$$Vlp=\tfrac{1}{2}\cdot\{VT-Ra\cdot(1-PAT)\cdot Ia+Vup\}-Rb\cdot\{PAT\cdot Ib+Ic\} \tag{8b}$$

Here, a parameter α is introduced, which defines a circuit constant.

$$Rb=\alpha\cdot Ra \tag{9a}$$

$$Ib=Ia/(2\cdot\alpha) \tag{9b}$$

By substituting Expressions (9a) and (9b) into Expressions (8a) and (8b), the following Expressions (10a) and (10b) are obtained.

$$Vhp=\tfrac{1}{2}\cdot\{VT-Ra\cdot Ia+Vun\}-Rb\cdot Ic \tag{10a}$$

$$Vlp=\tfrac{1}{2}\cdot\{VT-Ra\cdot Ia+Vup\}-Rb\cdot Ic \tag{10b}$$

Directing attention to the first comparator CMP1 and the second comparator CMP2, the comparison signals are switched as follows.

When Vhp is greater than Vhn, FAIL_H=1

When Vhp is smaller than Vhn, FAIL_H=0

When Vlp is greater than Vln, FAIL_L=1

When Vlp is smaller than Vln, FAIL_L=0 (11)

The following two inequality expressions are solved using Expressions (2a), (2b), (10a), and (10b), thereby obtaining the following Expressions (13a) and (13b).

$$Vhp>Vhn \tag{12a}$$

$$Vlp>Vln \tag{12b}$$

$$Vup-Vun<2\cdot Rc\cdot Ic \tag{13a}$$

$$Vup-Vun>-2\cdot Rc\cdot Ic \tag{13b}$$

Here, a voltage VO is defined using the following Expression (14), thereby obtaining the following Expressions (15a) and (15b).

$$VO=2\cdot Rc\cdot Ic \tag{14}$$

$$Vup-Vun<VO \tag{15a}$$

$$Vup-Vun>-VO \tag{15b}$$

That is to say, the comparison signals output from the first comparator CMP1 and the second comparator CMP2 are represented by the following Expressions.

When (Vup−Vun) is smaller than VO, FAIL_H=1

When (Vup−Vun) is greater than VO, FAIL_H=0

When (Vup−Vun) is greater than −VO, FAIL_L=1

When (Vup−Vun) is smaller than −VO, FAIL_L=0 (16)

Based upon the above considerations, the following advantages can be clearly understood.

Directing attention to the values of the comparison signals FAIL_H and FAIL_L represented by Expressions (16), these comparison signals depend upon only the differential signals Vup and Vun transmitted from the DUT 102. That is to say, such an arrangement cancels out the effects of the differential signals which are generated by the main driver amplifier AMP1 according to the pattern data PAT.

Furthermore, ordinary differential receivers require a differential amplifier (analog subtractor) which amplifies the difference between the differential signal pair so as to convert the differential input signal into a single-ended signal. However, the present embodiment has the advantage that the receiver does not require such a differential amplifier. It is difficult to design a high-speed differential amplifier having high linearity. Accordingly, it is easy to design the ATE 100 shown in FIG. 1. Also, such an arrangement can be applied to a test for a high-speed differential signal.

Description has been made regarding the configuration and the operation of the ATE 100 according to the present embodiment. The above-described embodiments have been described for exemplary purposes only, and are by no means intended to be interpreted restrictively. Rather, it can be readily conceived by those skilled in this art that various modifications may be made by making various combinations of the aforementioned components or processes, which are also encompassed in the technical scope of the present invention.

Figure 3:
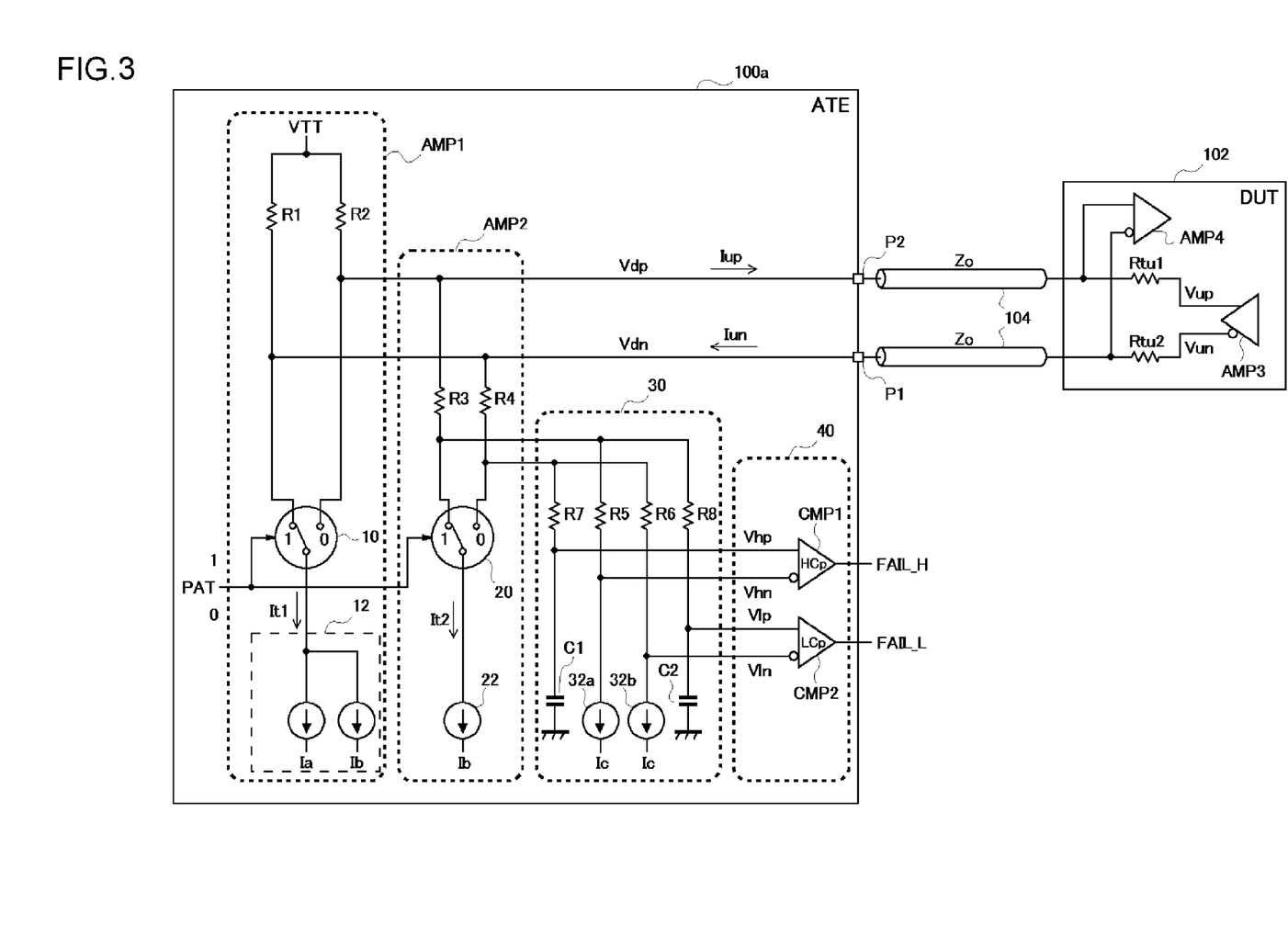
FIG. 3 is a circuit diagram which shows a configuration of an ATE according to a first modification.

FIG. 3 is a circuit diagram which shows a configuration of an ATE 100a according to a first modification. The ATE 100a includes a seventh resistor R7, an eighth resistor R8, a first capacitor C1, and a second capacitor C2, in addition to the configuration of the ATE 100 shown in FIG. 1.

The seventh resistor R7 is provided between the non-inverting input terminal of the first comparator CMP1 and the second terminal of the fourth resistor R4. The eighth resistor R8 is provided between the non-inverting input terminal of the second comparator CMP2 and the second terminal of the third resistor R3.

The first capacitor C1 is provided between the non-inverting input terminal of the first comparator CMP1 and the fixed-voltage terminal (ground terminal). The second capacitor C2 is provided between the non-inverting input terminal of the second comparator CMP2 and the ground terminal.

The seventh resistor R7, the eighth resistor R8, the first capacitor C1, and the second capacitor C2 are provided in order to provide time-constant matching between the input terminals of the first comparator CMP1 and the second comparator CMP2. That is to say, the parasitic capacitances of the third current source 32a and the fourth current source 32b combine with the fifth resistor R5 and the sixth resistor R6, respectively, so as to form low-pass filters. However, such an arrangement shown in FIG. 3 is capable of canceling out the effect of these low-pass filters.

Moreover, a modification as shown in FIG. 3 may include a first dummy current source, with the current value set to zero, having the same configuration as that of the third current source 32a, instead of the first capacitor C1. In the same way, such a modification may include a second dummy current source, with the current value set to zero, having the same configuration as that of the fourth current source 32b, instead of the second capacitor C2. Such a modification provides high precision capacity matching.

Furthermore, a modification as shown in FIG. 3 may have a configuration including only the first capacitor C1 and the second capacitor C2. Also, such a modification may include only the seventh resistor R7 and the eighth resistor R8.

Figure 4:
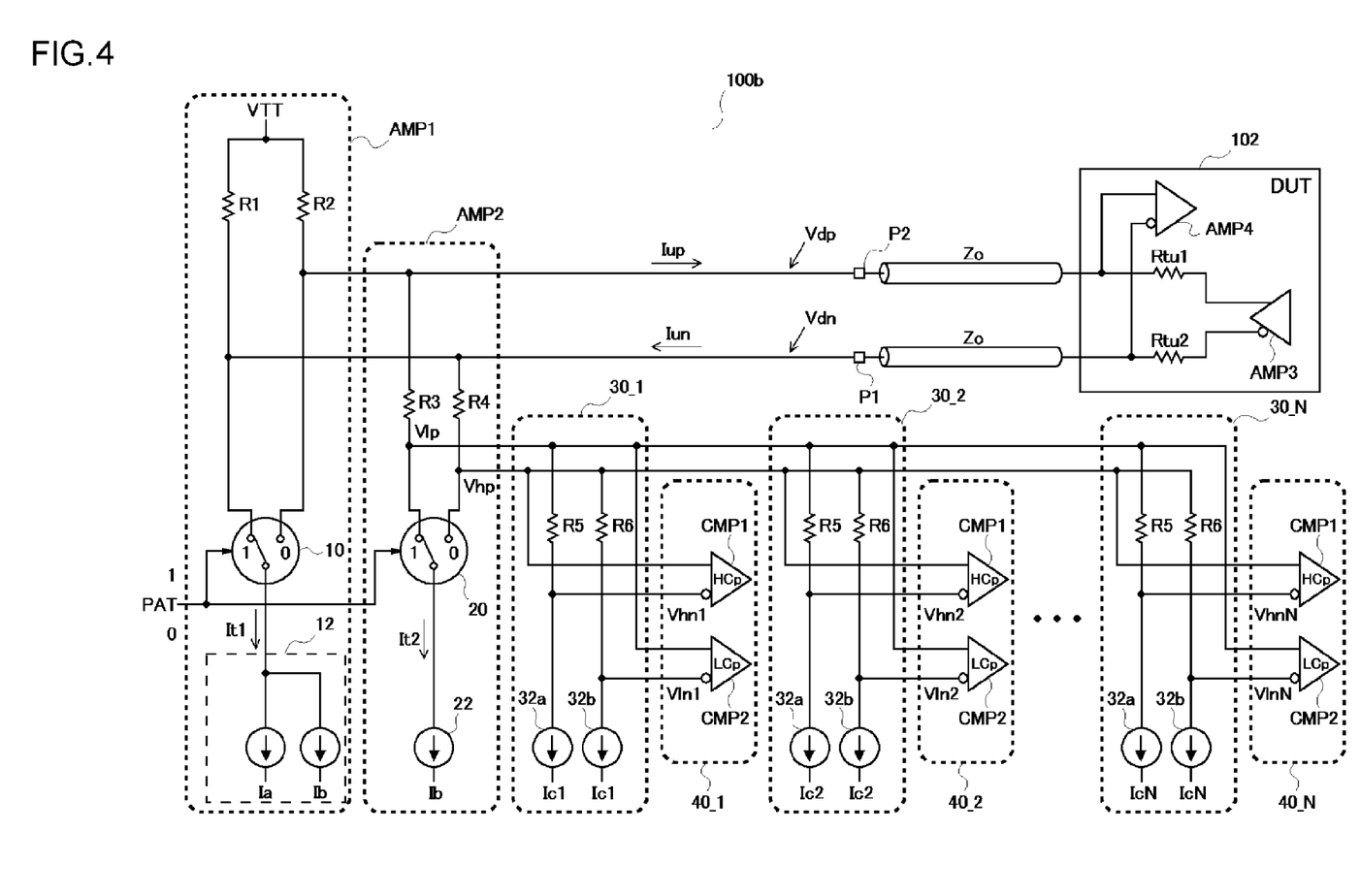
FIG. 4 is a circuit diagram which shows a configuration of an ATE according to a second modification.

FIG. 4 is a circuit diagram which shows a configuration of an ATE 100b according to a second modification. The ATE 100b includes N (N is an integer which is equal to or greater than 2) level shift circuits 30_1 through 30_N, and N comparator circuits 40_1 through 40_N, which are provided to the level shift circuits 30_1 through 30_N, respectively.

Such a configuration is made such that there is no difference in the resistance of the fifth resistor R5 and the resistance of the sixth resistor R6 among the level shift circuits 30_1 through 30_N. Furthermore, such a configuration is made such that there is a difference in the constant current generated by the third current source 32a and the constant current generated by the fourth current source 32b among the level shift circuits 30_1 through 30_N.

With such a modification, the multiple level shift circuits 30_1 through 30_N generate different level shift amounts $\Delta V\_1$ through $\Delta V\_N$. Thus, such a modification is capable of comparing the amplitude of the differential signal Vup–Vun with multiple threshold levels VO1 through VON.

With the constant currents generated by the third current source 32a and the fourth current source 32b provided to the i'th level shift circuit 30__i as Ici, the aforementioned Expression (5) is modified as follows.

$$VTT = VT + Ra \cdot (Ib + \Sigma Ici) \tag{5'}$$

In this case, the threshold level VOi set for the i'th comparator circuit 40__i is represented by the following Expression.

$$VOi = 2 \cdot Rc \cdot Ici \tag{14'}$$

In a case in which a high-speed differential amplifier (analog subtractor) can be designed, the following embodiment can be made.

Figure 5:
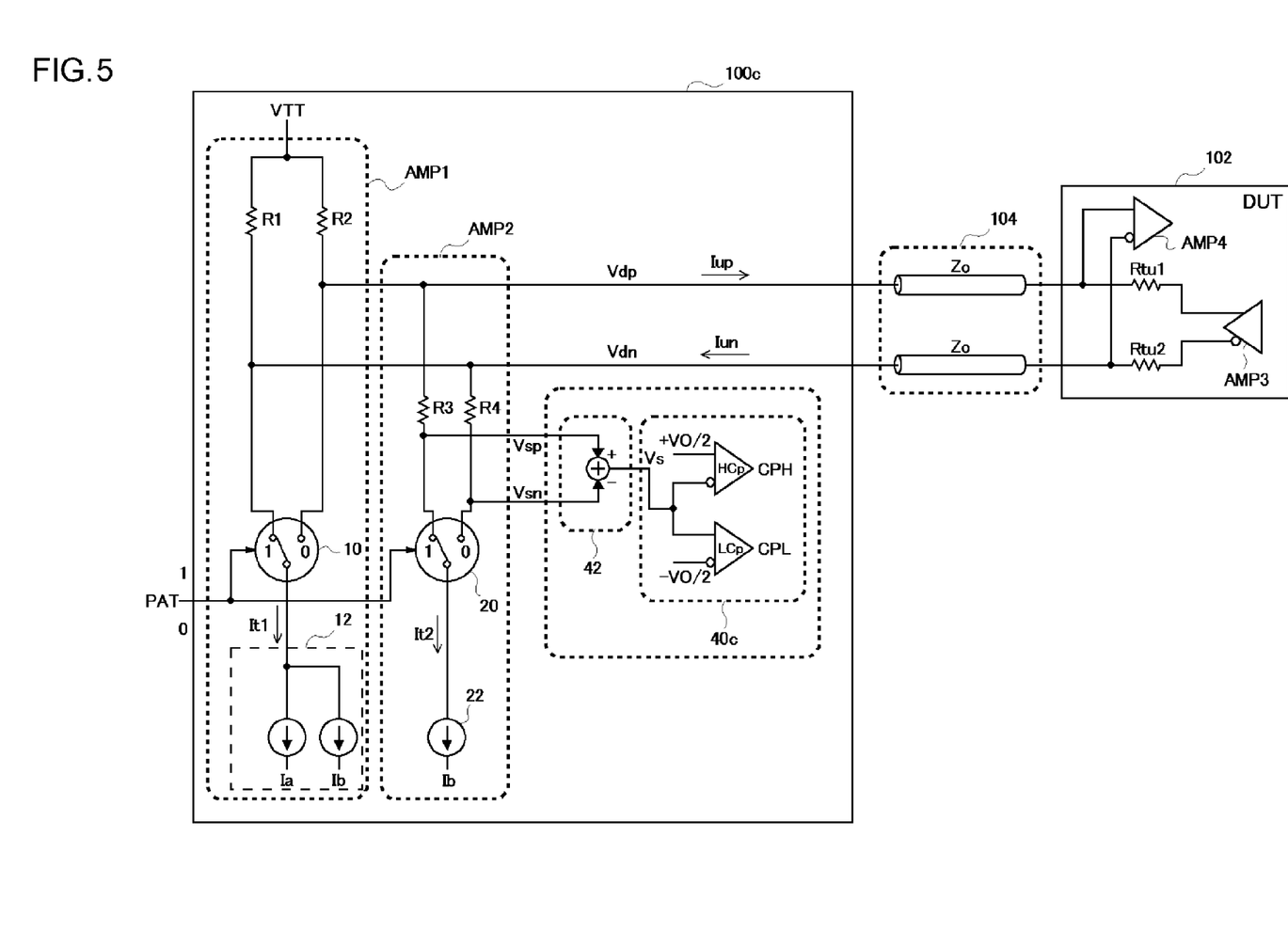
FIG. 5 is a circuit diagram which shows a configuration of an ATE according to a second embodiment.

FIG. 5 is a circuit diagram which shows a configuration of an ATE 100c according to a second embodiment. The ATE 100c shown in FIG. 5 includes an analog subtractor 42 and a comparator circuit 40c, instead of the level shift circuit 30 and the comparator circuit 40 shown in FIG. 1. The analog subtractor 42 subtracts the electric potential Vsn at the second terminal of the fourth resistor R4 from the electric potential Vsp at the second terminal of the third resistor R3, and outputs the differential voltage Vs=Vsp−Vsn according to the difference thus calculated.

The comparator circuit 40c includes a comparator HCp and a comparator LCp. The comparator HCp compares the differential voltage Vs with an upper threshold voltage VO/2. The comparator LCp compares the differential voltage Vs with a lower threshold voltage −VO/2.

The ATE 100c shown in FIG. 5 is also capable of canceling out the signal components generated by the main driver amplifier AMP1 in the signal voltage Vs, thereby extracting the amplitude of the differential signal transmitted from the DUT 102 as the evaluation target.

While the preferred embodiments of the present invention have been described using specific terms, such description is for illustrative purposes only, and it is to be understood that changes and variations may be made without departing from the spirit or scope of the appended claims.

What is claimed is:

1. A test apparatus which transmits/receives a differential signal to/from a device under test in a bidirectional manner via a differential transmission line so as to test the device under test, including:
    first and second input/output terminals connected to the differential transmission line;
    a first resistor provided between the first input/output terminal and a fixed-voltage terminal;
    a second resistor provided between the second input/output terminal and the fixed-voltage terminal;
    a first current source which generates a predetermined first tail current;
    a first current-switching switch which receives pattern data to be transmitted to the device under test, selects either the first input/output terminal side or the second input/output terminal side according to the value of the pattern data thus received, and couples the input/output terminal thus selected with the first current source;
    a third resistor with the first terminal thereof connected to the second input/output terminal;
    a fourth resistor with the first terminal thereof connected to the first input/output terminal;
    a second current source which generates a predetermined second tail current;
    a second current-switching switch which receives the pattern data, selects either the first input/output terminal side or the second input/output terminal side according to the value of the pattern data thus received, and couples the input/output terminal thus selected with the second current source;
    a level shift circuit which shifts the electric potential at the second terminal of the third resistor and the electric potential at the second terminal of the fourth resistor by a predetermined level; and
    a comparator circuit which compares the electric potential at the second terminal of the third resistor, which has been level-shifted by the level shift circuit, with the electric potential at the second terminal of the fourth resistor, generates a first comparison signal according to the comparison result, compares the electric potential at the second terminal of the fourth resistor, which has been level-shifted by the level shift circuit, with the electric potential at the second terminal of the third resistor, and generates a second comparison signal according to the comparison result.

2. A test apparatus according to claim 1, wherein, with the resistances of the first and second resistors as Ra, the resistances of the third and fourth resistors are set to approximately the same value represented by $\alpha \cdot Ra$ ($\alpha$ represents a parameter).

3. A test apparatus according to claim 2, wherein, with the current value of the second tail current as Ib, and with the current value of the first tail current as (Ia+Ib), the Expression Ib=Ia/(2·$\alpha$) is satisfied.

4. A test apparatus according to claim 1, wherein the level shift circuit includes:
    a fifth resistor with the first terminal thereof connected to the second terminal of the third resistor;
    a third current source which is connected to the second terminal of the fifth resistor, and generates a predetermined current;

a sixth resistor with the first terminal thereof connected to the second terminal of the fourth resistor; and a fourth current source which is connected to the second terminal of the sixth resistor, and generates a predetermined current, and wherein the electric potentials at the second terminals of the fifth and sixth resistors are respectively output.

5. A test apparatus according to claim 4, wherein the comparator circuit includes:

a first comparator which compares the electric potential at the second terminal of the third resistor, which has been level-shifted by the level shift circuit, with the electric potential at the second terminal of the fourth resistor; and a second comparator which compares the electric potential at the second terminal of the fourth resistor, which has been level-shifted by the level shift circuit, with the electric potential at the second terminal of the third resistor, and wherein the test apparatus further includes:

a seventh resistor provided between one of the input terminals of the first comparator and the second terminal of the fourth resistor; and an eighth resistor provided between one of the input terminals of the second comparator and the second terminal of the third resistor.

6. A test apparatus according to claim 4, wherein the comparator circuit includes:

a first comparator which compares the electric potential at the second terminal of the third resistor, which has been level-shifted by the level shift circuit, with the electric potential at the second terminal of the fourth resistor; and a second comparator which compares the electric potential at the second terminal of the fourth resistor, which has been level-shifted by the level shift circuit, with the electric potential at the second terminal of the third resistor, and wherein the test apparatus further includes:

a first capacitor provided between one of the input terminals of the first comparator and a fixed-voltage terminal; and a second capacitor provided between one of the input terminals of the second comparator and a fixed-voltage terminal.

7. A test apparatus according to claim 4, wherein the comparator circuit includes:

a first comparator which compares the electric potential at the second terminal of the third resistor, which has been level-shifted by the level shift circuit, with the electric potential at the second terminal of the fourth resistor; and a second comparator which compares the electric potential at the second terminal of the fourth resistor, which has been level-shifted by the level shift circuit, with the electric potential at the second terminal of the third resistor, and wherein the test apparatus further includes:

a first dummy current source, with the current value set to zero, which is provided between one of the input terminals of the first comparator and a fixed-voltage terminal, and has the same configuration as that of the third current source; and a second dummy current source, with the current value set to zero, which is provided between one of the input terminals of the second comparator and a fixed-voltage terminal, and has the same configuration as that of the fourth current source.

8. A test apparatus according to claim 1, wherein a plurality of level shift circuits are provided in parallel, and wherein the comparator circuit is provided to each of the plurality of level shift circuits.

9. A test apparatus according to claim 1, wherein the first current-switching switch is a differential transistor pair including:

a first transistor with the first terminal thereof connected to the first input/output terminal; and a second transistor with the first terminal thereof connected to the second input/output terminal, and with the second terminal thereof connected to the second terminal of the first transistor so as to form a common second terminal, and wherein the second current-switching switch is a differential transistor pair including:

a third transistor with the first terminal thereof connected to the second terminal of the third resistor; and a fourth transistor with the first terminal thereof connected to the second terminal of the fourth resistor, and with the second terminal thereof connected to the second terminal of the third transistor so as to form a common second terminal.

* * * * *